(12) United States Patent
Pilz

(10) Patent No.: US 6,567,487 B1
(45) Date of Patent: May 20, 2003

(54) METHOD FOR THE SAMPLING OF BIPHASE CODED DIGITAL SIGNALS

(75) Inventor: Axel Pilz, Neuenstein (DE)

(73) Assignee: Patent-Treuhand-Gesellschaft fuer Elektrische Gluehlampen mbH, Munich (DE)

(*) Notice: Subject to any disclaimer, the term of this patent is extended or adjusted under 35 U.S.C. 154(b) by 531 days.

(21) Appl. No.: 09/613,864

(22) Filed: Jul. 11, 2000

(30) Foreign Application Priority Data

Jul. 15, 1999 (DE) ......................................... 199 32 692

(51) Int. Cl.[7] ................................................. H04L 7/02
(52) U.S. Cl. ...................... 375/360; 375/361; 341/70; 341/71
(58) Field of Search ................................. 375/360, 361, 375/333; 341/68, 69, 70, 71, 72, 73, 74

(56) References Cited

U.S. PATENT DOCUMENTS 5,379,037 A * 1/1995 Harrison et al. ............... 341/71
5,465,268 A * 11/1995 Rainbolt ....................... 375/333
6,487,263 B1 * 11/2002 Bianchessi et al. ......... 375/361

* cited by examiner

*Primary Examiner*—Don N. Vo
(74) *Attorney, Agent, or Firm*—Carlo S. Bessone

(57) ABSTRACT

The invention relates to a method for the sampling of biphase coded digital signals by reception means which have at least one signal input having switchable signal edge sensitivity or at least two signal inputs having different signal edge sensitivity for the reception of such signals. The signals to be received are sampled precisely once per data bit, namely during the transmission of the first half-bit. The signal edges (F1–F5) of each bit are utilized for synchronizing the signal input with the control signal and for detecting transmission errors. Each signal sampling (S1–S5) is followed by a time window ($\Delta t$) within which the reception of the signal edge of the present bit is expected and evaluated as permissible. The signal edge sensitivity of the at least one signal input is set as a function of the sampled logic level of the first half-bit of the respectively transmitted bit of the signal.

6 Claims, 3 Drawing Sheets

METHOD FOR THE SAMPLING OF BIPHASE CODED DIGITAL SIGNALS

Figure 1:
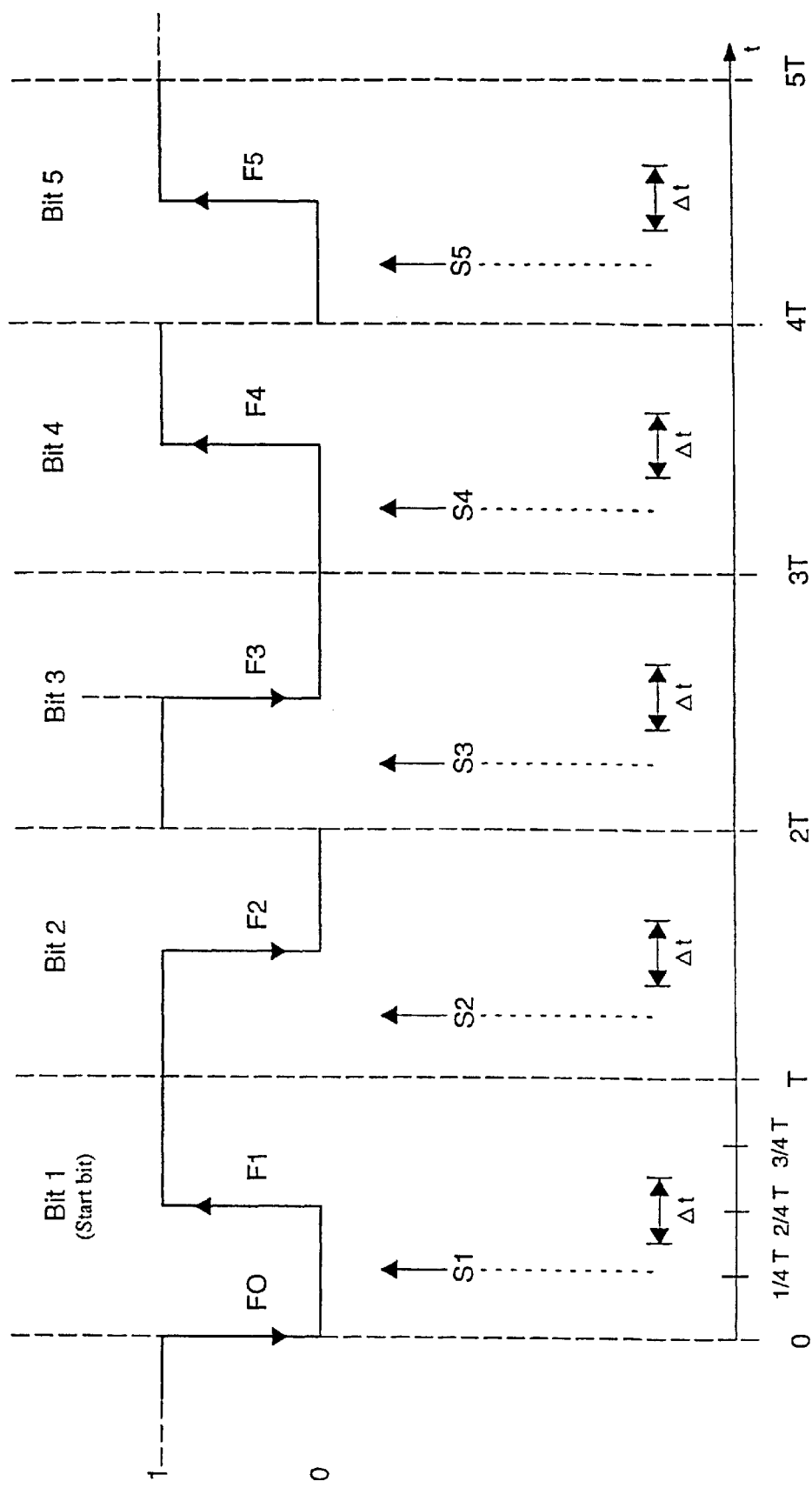

The invention relates to a method for the sampling of biphase coded digital signals in accordance with Patent claim 1. In particular, the invention also relates to a method for the central driving of the electrical loads of a lighting system, for example the operating units of the lamps, by means of biphase coded digital control signals.

TECHNICAL FIELD

When a digital signal is subject to biphase coding, each bit of the digital signal is subdivided into two half-bits having different logic states. In each bit of the signal, the first and second half-bits have different logic levels and a falling or a rising signal edge occurs between these two half-bits, depending on whether the first or the second half-bit is at the logic level "1". During regular data transmission, therefore, the logic levels "0" and "1" have to alternate periodically.

In order to receive biphase coded digital signals, it is customary firstly to effect a synchronization with the edge of the start bit of the received signal and to start sampling this signal with a period duration which is shorter than the transmission duration of a half-bit. Thus, at least one sampling is effected per half-bit. The quality of this method, in particular the detection of transmission errors, improves as the number of individual samplings for each half-bit rises. With the aid of an evaluation device, an average value is formed from the individual samplings of the logic level of the half-bit and, by comparison with two threshold values, the logic level of this half-bit is determined as "0" or "1". Although increasing the number of individual samplings improves the error detection, at the same time, however, it also increases the system loading and leads to the system slowing down in the case of so-called multitasking systems.

SUMMARY OF THE INVENTION

The object of the invention is to provide a method for the sampling of biphase coded digital signals by reception means which have at least one signal input having switchable signal edge sensitivity which requires the smallest possible number of samplings of the received signal and nevertheless ensures synchronization with the transmission and also detection of transmission errors.

This object is achieved according to the invention by means of the features of Patent claim 1. Particularly advantageous embodiments of the invention are described in the subclaims.

In the invention's method for the sampling of biphase coded digital signals by reception means which have at least one signal input having switchable signal edge sensitivity or at least two signal inputs having different signal edge sensitivity for the reception of such signals, in order to receive such a signal A) the signal edge sensitivity of the at least one signal input is set to a falling signal edge if its quiescent state logic level is "1", and its signal edge sensitivity is set to a rising signal edge if its quiescent state logic level is "0", in order to detect the beginning of a signal, or the signal input having the corresponding signal edge sensitivity is activated in order to detect the beginning of a signal, B) sampling of the logic level of the first half-bit of the instantaneously received bit of the signal is carried out, C) the signal edge sensitivity of the at least one signal input is set as a function of the logic level of the sampled first half-bit of the instantaneously received bit, or the signal input having the corresponding signal edge sensitivity is activated as a function of the logic level of the sampled first half-bit of the instantaneously received bit, D) a time window ($\Delta t$) is prescribed during which the occurrence of the signal edge between the first and second half-bits of the abovementioned bit of the signal is expected and evaluated as permissible, E) a check is made to determine whether the abovementioned signal edge has occurred within the prescribed time window, and, if the signal edge between the first and second half-bits has been detected within the prescribed time window, method steps B) to E) are repeated for the next bit of the signal, or the signal reception is otherwise terminated.

The method according to the invention provides only a single sampling of the signal per bit. It is wholly sufficient for just the respective first half-bit of each data bit of the signal to be sampled once in order to evaluate the signal and reliably detect errors in the coding of the signal. According to the invention, the signal edge occurring in each bit of the signal is ultilized for synchronizing the at least one signal input with the received signal and for detecting errors in the coding of the signal. The prescription of a time window during which the signal edge between the first and second half-bits can be detected limits the permissible fluctuations of the temporal bit length and thus also the permissible fluctuations of the signal transmission rate.

The method according to the invention can advantageously be applied to a lighting system which has a plurality of lamps, at least one operating unit for the lamps and at least one control unit for driving the at least one operating unit.

DESCRIPTION OF THE PREFERRED EXEMPLARY EMBODIMENT

Figure 2:
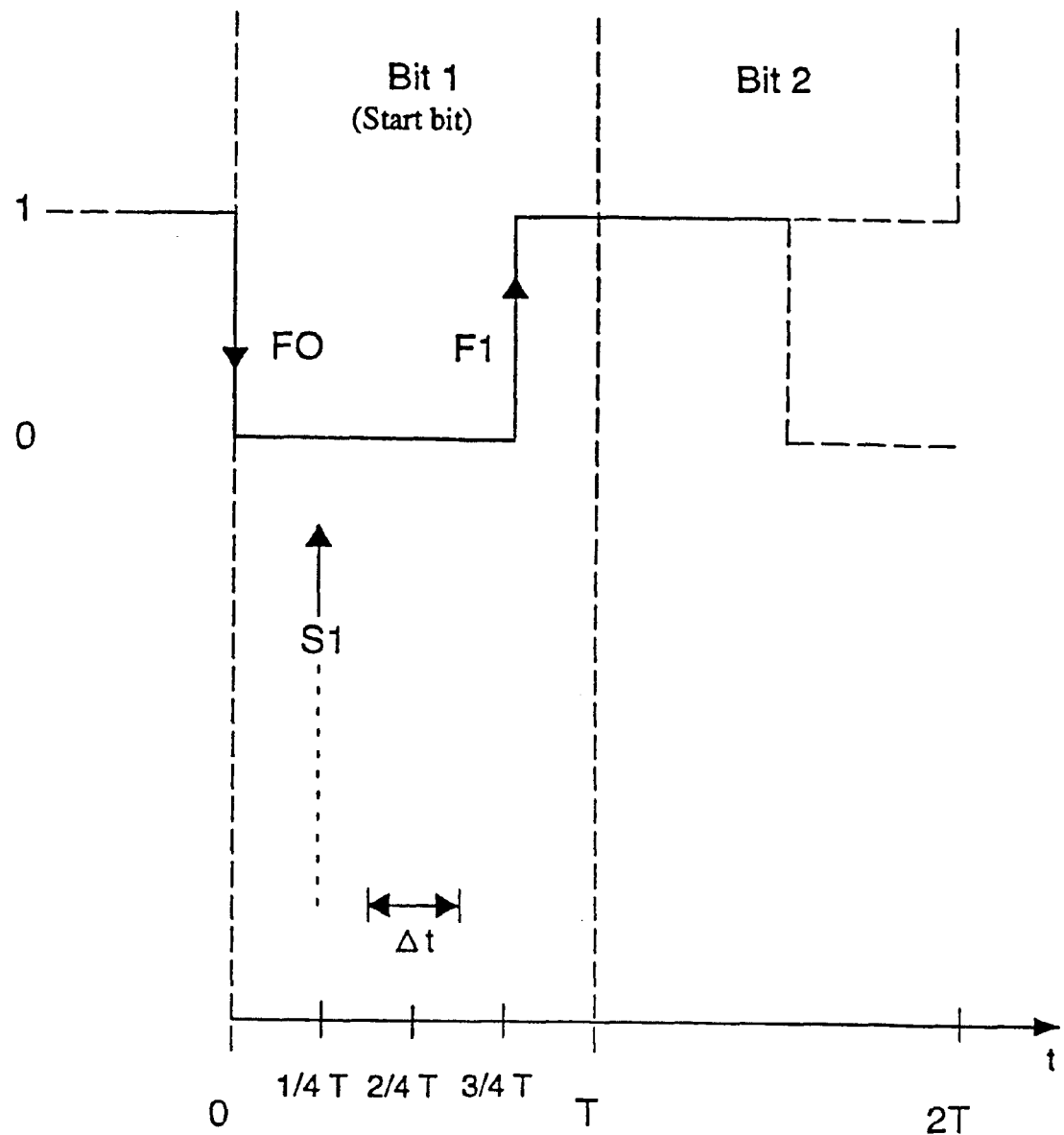
Figure 3:
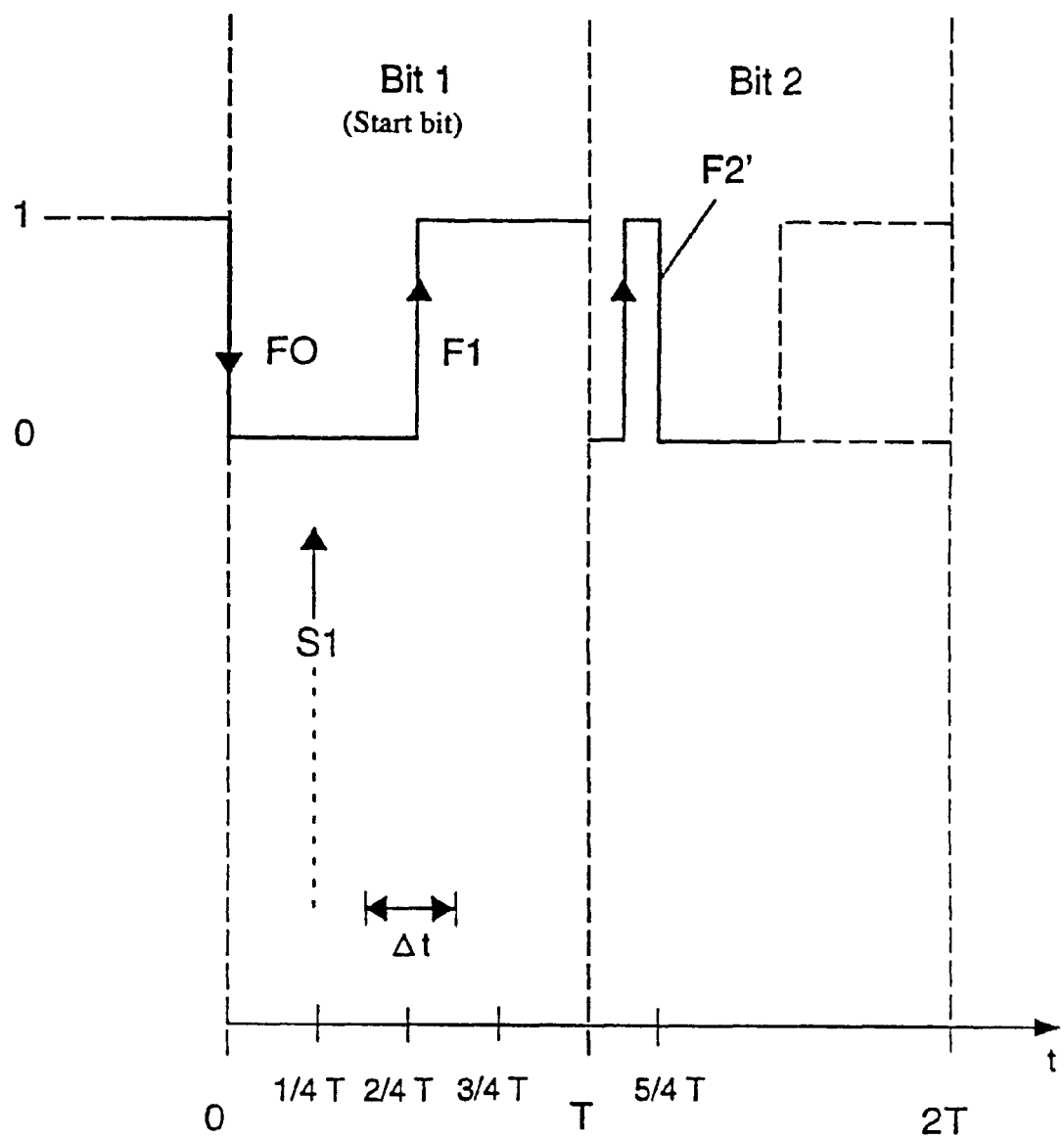

The invention is explained in more detail below using a preferred exemplary embodiment. In the figures:

FIG. 1 shows the sampling of an error-free control signal by means of the method according to the invention, FIG. 2 shows the detection of an impermissible bit transmission duration in the start bit by means of the method according to the invention, and FIG. 3 shows the detection of an interference signal within the control signal by means of the method according to the invention.

The method according to the invention is described in more detail using an exemplary embodiment with the aid of FIGS. 1 to 3. As already indicated above, the method according to the invention can advantageously be applied to a lighting system which has a plurality of luminaires and possibly further electrical loads, such as for example servo motors for operating blinds, etc., and also at least one central control unit for driving the luminaires and possible other electrical loads. Each luminaire is equipped with one or more lamps and an electrical operating unit for operating the lamps of this luminaire. There are bidirectional connecting lines between the central control unit and the operating units and also possible further electrical loads, which connecting lines enable the transmission of biphase coded digital voltage signals between the control unit and the operating units and also possible other electrical loads in both directions The operating units are electronic ballasts (EBs) each equipped with a microcontroller for receiving and for evaluating the control signals sent by the central control unit and also for acknowledgements to the central control unit. Each microcontroller has a control signal input having switchable signal edge sensitivity for the reception of biphase coded digital control signals. By means of these control signals, individual operating units or operating units combined in groups are driven centrally by the control unit, and the lamps connected to the operating units are switched on or off or dimmed, or their operating states are interrogated.

In the quiescent state, the transmission lines between the control signal output of the central control unit and the control signal inputs of the microcontrollers are at the logic level "1". In order to be able to detect the beginning of a control signal, the edge sensitivity of the control signal inputs of the microcontrollers is set to a falling signal edge, since the first half-bit of the start bit of each control signal must begin with the logic level "0". The biphase coded digital control signals have a prescribed length of 16 bits, for example. They begin with a start bit and end with a stop bit. The control signals contain the operating address of the operating units to be driven and one or more control commands for these operating units.

An example of an error-free, biphase coded digital control signal is illustrated partially and schematically in FIG. 1. The falling edge F0 of the start bit of the control signal is detected at the control signal inputs of the microcontrollers. At the instant $t=\frac{1}{4}$ T, where T designates the transmission duration of a bit of the control signal, the first sampling S1 of the control signal is effected. In this case, the logic level "0" of the first half-bit of the bit 1 (start bit) is sampled. In addition, the edge sensitivity of the control signal inputs is switched to a rising signal edge as a function of the sampled logic level "0" of the first half-bit of the start bit. The signal edge sensitivity of a control signal input is switched for example with the aid of a register integrated in the microprocessor by the setting or resetting of a bit. At the instant $\frac{1}{8}$ T after the sampling S1 of the first half-bit of the start bit, a time window Δt is opened, whose duration is $\frac{1}{4}$ T in the present example, during which the reception of the rising signal edge F1 between the first and second half-bits of the start bit is expected. In the case of the control signal represented in FIG. 1, the signal edge F1 of the start bit occurs at the expected instant $t=\frac{1}{2}$ T and thus within the prescribed time period Δt after the sampling S1. The signal edge F1 is therefore assessed as permissible. At the instant $t=\frac{5}{4}$ T, the next sampling S2 of the control signal is carried out. The logic level "1" of the first half-bit of bit 2 is determined by the sampling S2. The edge sensitivity of the control signal input or of the control signal inputs is set to a falling signal edge, since a logic "1" was detected during the sampling S2. Once again $\frac{1}{8}$ T after the sampling S2, the prescribed time window Δt is activated, during which the falling signal edge F2 of bit 2 is expected. The signal edge F2 between the first and second half-bits of bit 2 occurs at the instant $t=\frac{3}{2}$ T. This instant lies within the time window Δt after the sampling S2 and the signal edge F2 is therefore evaluated as permissible. At the instant $t=\frac{9}{4}$ T, the third sampling S3 of the control signal is effected. In this case, the logic level "1" of the half-bit of bit 3 is detected. The edge sensitivity of the control signal input or of the control signal inputs is set to a falling signal edge, in accordance with the detected logic level "1". At the time interval of $\frac{1}{8}$ T after the sampling S3, the time window Δt is activated again, during which the reception of the falling signal edge F3 of bit 3 is expected. The signal edge F3 of bit 3 is received at the expected instant $t=\frac{5}{2}$ T. This signal edge is assessed as permissible since it occurred within the time window Δt after the sampling S3. At the instant $t=\frac{13}{4}$ T, the fourth sampling S4 of the control signal is effected. In this case, the logic level "0" of the first half-bit of bit 4 is determined. In accordance with the determined logic level "0", the edge sensitivity of the control signal input or of the control signal inputs is set to a rising signal edge. At the time interval $\frac{1}{8}$ T after the sampling S4, a time window of length Δt is additionally activated, within which the reception of the rising signal edge F4 of bit 4 is expected. The signal edge F4 is detected at the instant $t=\frac{7}{2}$ T and thus lies within the permissible time window Δt after the sampling S4. At the instant $t=\frac{17}{4}$ T, the sampling S5 of the logic level "0" of the first half-bit of bit 5 is effected. The signal edge sensitivity of the control signal input or of the control signal inputs is accordingly set to a rising signal edge. Within the time window Δt which begins $\frac{1}{8}$ T after the sampling S5 was performed, the expected signal edge F5 of bit 5 is detected and is thus evaluated as permissible. The method is continued completely analogously to this for all further bits of the control signal. The control signal is sampled in a bit-by-bit manner, at the interval of the time T required for the transmission of a bit, and in each case during the reception of the first half-bit. Each sampling is followed, at the time interval of $\frac{1}{8}$ T, by a time window of length Δt, during which the signal edge of the currently transmitted and received bit of the control signal is expected and assessed as permissible. The end of the control signal is marked by one or more stop bits and/or ascertained by a bit counter. The beginning and end of the time windows Δt after each sampling are generated by means of a timer integrated in the microcontrollers.

FIGS. 2 and 3 show the detection of erroneous control signals by means of the signal sampling method according to the invention. FIG. 2 illustrates an example of a control signal with an erroneous start bit. The falling edge F0 of the start bit of the control signal is detected at the control signal inputs of the microcontrollers. At the instant $t=\frac{1}{4}$ T, where T designates the transmission duration of a bit of the control signal, the first sampling S1 of the control signal is effected. In this case, the logic level "0" of the first half-bit of the start bit is sampled. In addition, the edge sensitivity of the control signal inputs is switched to a rising signal edge as a function of the sampled logic level "0" of the first half-bit of the start bit. At the same time as the sampling S1 of the first half-bit of the start bit, a time window Δt is defined whose duration or length is $\frac{1}{4}$ T in the present example and during which the reception of the rising signal edge F1 between the first and second half-bits of the start bit is expected. The expected signal edge F1 of the start bit does not occur at the expected instant T/2, but rather considerably later. Not until after the time window Δt has elapsed is the said signal edge detected at the control signal input or the control signal inputs. As a result, the signal edge F1 is evaluated as impermissible and the control signal reception is terminated. In this way, timing errors and impermissible fluctuations of the transmission rate (baud rate) are detected by the sampling method according to the invention.

FIG. 3 illustrates a control signal superposed with an interference signal. The interference signal occurs during the transmission or the reception of the first half-bit of bit 2. The reception and the sampling of the start bit and the setting of the edge sensitivity proceed in the same way as has already been described for the control signal as shown in FIG. 1. The rising signal edge F2' of the interference signal is detected and evaluated as impermissible since it occurred outside the time window Δt after the sampling S1 and before the definition of the next time window Δt. The control signal reception is therefore terminated.

The invention is not restricted to the exemplary embodiment explained in more detail above, nor to the above-described application of the method to a lighting system. The invention's method for the sampling of biphase coded digital signals can generally be used for correspondingly coded digital data transmission provided that the receivers are equipped with signal inputs which allow the signal edge sensitivity to be switched, or the receivers have signal inputs having different signal edge sensitivity which are connected to a suitable logic circuit, or alternatively the receivers have at least one signal input for detecting falling signal edges and at least one input for detecting rising signal edges, between which a changeover is made in accordance with the result of the last sampling.

What is claimed is:

1. Method for the sampling of biphase coded digital signals by reception means which have at least one signal input having switchable signal edge sensitivity or at least two signal inputs having different signal edge sensitivity for the reception of such signals, where
   A) the signal edge sensitivity of the at least one signal input having switchable signal edge sensitivity is set to a falling signal edge (F0) if its quiescent state logic level is "1", and the signal edge sensitivity of the at least one signal input is set to a rising signal edge if its quiescent state logic level is "0", or the signal input having the corresponding signal edge sensitivity is activated in order to detect the beginning of a signal,
   B) sampling of the logic level of the first half-bit of the instantaneously received bit of the signal is carried out,
   C) the signal edge sensitivity of the at least one signal input is set as a function of the logic level of the sampled first half-bit of the instantaneously received bit, or the signal input having the corresponding signal edge sensitivity is activated as a function of the logic level of the sampled first half-bit of the instantaneously received bit,
   D) a time window ($\Delta t$) is prescribed during which the occurrence of the signal edge (F1, F2, F3, F4, F5) between the first and second half-bits of the abovementioned bit of the signal is expected and evaluated as permissible,
   E) a check is made to determine whether the abovementioned signal edge (F1, F2, F3, F4, F5) has occurred within the prescribed time window ($\Delta t$), and, if the signal edge (F1, F2, F3, F4, F5) between the first and second half-bits has been detected within the prescribed time window ($\Delta t$), method steps B) to E) are repeated for the next bit of the signal, or the signal reception is otherwise terminated.

2. Method according to claim 1, characterized in that at most one logic level sampling is carried out for each bit of the signal to be received.

3. Method according to claim 1, characterized in that after each sampling (S1, S2, S3, S4, S5), a time window ($\Delta t$) in accordance with method step D) is opened.

4. Method according to claim 1, characterized in that the time window ($\Delta t$) is at most as long as the transmission duration (T) of a bit.

5. Method according to claim 1, characterized in that the sampling of the first half-bits is carried out at constant time intervals (T).

6. Application of the method according to claim 1 to a lighting system which has a plurality of lamps, at least one operating unit for the lamps and at least one control unit for driving the at least one operating unit by means of biphase coded digital control signals.

* * * * *